United States Patent
Kang et al.

(10) Patent No.: US 12,292,693 B2
(45) Date of Patent: *May 6, 2025

(54) DATA INSPECTION FOR DIGITAL LITHOGRAPHY FOR HVM USING OFFLINE AND INLINE APPROACH

(71) Applicant: Applied Materials, Inc., Santa Clara, CA (US)

(72) Inventors: Chung-Shin Kang, San Jose, CA (US); Jun Yang, San Jose, CA (US); Hongbin Ji, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/415,430

(22) Filed: Jan. 17, 2024

(65) Prior Publication Data

US 2024/0152061 A1 May 9, 2024

Related U.S. Application Data

(63) Continuation of application No. 17/792,667, filed as application No. PCT/US2020/018546 on Feb. 18, 2020, now Pat. No. 11,914,305.

(51) Int. Cl.
*G03F 7/00* (2006.01)

(52) U.S. Cl.
CPC ...... *G03F 7/70508* (2013.01); *G03F 7/70291* (2013.01); *G03F 7/704* (2013.01)

(58) Field of Classification Search
CPC .......... G03F 7/20; G03F 7/70; G03F 7/70291; G03F 7/704; G03F 7/70508;
(Continued)

(56) References Cited

U.S. PATENT DOCUMENTS

| 5,866,300 A | 2/1999 | Satoh et al. |
|---|---|---|
| 6,624,878 B1 | 9/2003 | Sandstrom et al. |

(Continued)

FOREIGN PATENT DOCUMENTS

| CN | 106647181 A | 5/2017 |
|---|---|---|
| KR | 20170020250 A | 2/2017 |
| TW | 201820050 A | 6/2018 |

OTHER PUBLICATIONS

PCT Application No. PCT/US2020/018546, International Search Report and Written Opinion dated Nov. 11, 2020, 11 pages.

(Continued)

*Primary Examiner* — Christina A Riddle
(74) *Attorney, Agent, or Firm* — Patterson + Sheridan, LLP

(57) ABSTRACT

In embodiments of a digital lithography system, physical design data prepared at a data prep server in a hierarchical data structure. A leaf node comprises a repeater nod, comprising a bitmap image and a plurality of locations at which the bitmap appears in a physical design. At an EYE server, a repeater node bitmap is adjusted based upon, for example, spatial light modulator rotational adjustment and substrate distortion. The adjusted repeater node and the plurality of locations in which the adjusted repeater appears is compared to the repeater of the data prep server and its plurality of locations. In further embodiments, a rasterizer generates a checksum of bitmap to be printed to a substrate, from the EYE server bitmap. The checksum is compared to a checksum of the EYE server bitmap.

20 Claims, 6 Drawing Sheets

(58) Field of Classification Search
CPC ..... G03F 7/70483–70541; G06F 11/10; G06F 11/1004
USPC ......... 355/18, 30, 52–55, 67–77, 133; 430/5
See application file for complete search history.

(56) References Cited

U.S. PATENT DOCUMENTS

| | | |
|---|---|---|
| 10,809,637 B1 | 10/2020 | Coskun |
| 11,914,305 B2 * | 2/2024 | Kang ................... G03F 7/70291 |
| 2006/0142967 A1 | 6/2006 | Hoeks |
| 2006/0228041 A1 * | 10/2006 | Joshi ................... G03F 7/70441 |
| | | 382/260 |
| 2009/0104549 A1 | 4/2009 | Sandstrom et al. |
| 2009/0210634 A1 * | 8/2009 | Tsuruta ............... G06F 11/1004 |
| | | 711/E12.001 |
| 2010/0142838 A1 | 6/2010 | Ivansen et al. |
| 2014/0023972 A1 | 1/2014 | Chen et al. |
| 2020/0019065 A1 | 1/2020 | Chen et al. |

OTHER PUBLICATIONS

1 Taiwan Application No. 113114619, Office Action and Search Report dated Sep. 30, 2024, 5 pages.

* cited by examiner

DATA INSPECTION FOR DIGITAL LITHOGRAPHY FOR HVM USING OFFLINE AND INLINE APPROACH

CROSS-REFERENCE TO RELATED APPLICATIONS

This application is a continuation of co-pending U.S. patent application Ser. No. 17/792,667, filed Feb. 18, 2020, which claims benefit of a § 371 of International patent application serial number PCT/US2020/018546, filed Feb. 18, 2020. Each of the aforementioned related patent applications are herein incorporated by reference.

BACKGROUND

Field

Embodiments of the present invention generally relate to a digital lithography system, and in particular to data management in a digital lithography system.

Description of the Related Art

Digital lithography ("DL") systems, such as those used to print complex circuitry on a substrate, utilize a number of computation engines as part of the process of transforming a customer design to a printed circuit. Customer design data, also known as physical design data, is typically first transformed to a format that a DL system can consume. Within the DL system this transformed data may then be segmented into discrete areas of the substrate upon which particular portions of the design are to be printed, as well as adjusted for physical characteristics of the substrate and operating parameters of the DL system. Finally, the DL system will convert the segmented and adjusted data to a format consumable by a spatial light modulator array that will be exposed to a laser, writing portions of the customer design to the substrate.

As the customer design undergoes a number of transformations before being written to a substrate, it is important that the final written image be true to the customer design. Conventional systems typically incorporate checks of the data within the DL system. However, due to the massive amount of data that makes up modern designs for printing with a DL system, these conventional systems are extremely slow and resource intensive, relying on repetitive comparisons of the same design primitives as between transformations, maintained in formats that require each primitive to be checked.

What is needed is a system and method to overcome the shortcomings of prior approaches, reduce the amount of data required for comparing, and speeding up the process of getting customer design data printed to substrates, in high volumes.

SUMMARY

Certain embodiments provide a method for data inspection of a digital lithography system. The method generally includes obtaining a data prep bitmap from a data prep server and optimizing the data prep bitmap at an EYE server to create an EYE server bitmap. The method may further include comparing the data prep bitmap to the EYE server bitmap and processing the EYE server bitmap with a rasterizer to create an EYE bitmap. In embodiments the method may further include creating a first checksum from the EYE server bitmap and a second checksum from the EYE bitmap and comparing the first checksum and second checksum with a processor.

Additional embodiments provide a digital lithography system comprising a processor and a memory for storing instructions, when executed by the processor, perform a method for data inspection. The method generally includes obtaining a data prep bitmap from a data prep server and optimizing the data prep bitmap at an EYE server to create an EYE server bitmap. The method may further include comparing the data prep bitmap to the EYE server bitmap and processing the EYE server bitmap with a rasterizer to create an EYE bitmap. In embodiments the method may further include creating a first checksum from the EYE server bitmap and a second checksum from the EYE bitmap and comparing the first checksum and second checksum with a processor.

In a further embodiment, a non-transitory computer readable medium comprises instructions that, when executed by a processor of a processing system, cause the processing system to perform a method for data inspection in a digital lithography system. The method generally includes obtaining a data prep bitmap from a data prep server and optimizing the data prep bitmap at an EYE server to create an EYE server bitmap. The method may further include comparing the data prep bitmap to the EYE server bitmap and processing the EYE server bitmap with a rasterizer to create an EYE bitmap. In embodiments the method may further include creating a first checksum from the EYE server bitmap and a second checksum from the EYE bitmap and comparing the first checksum and second checksum with a processor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
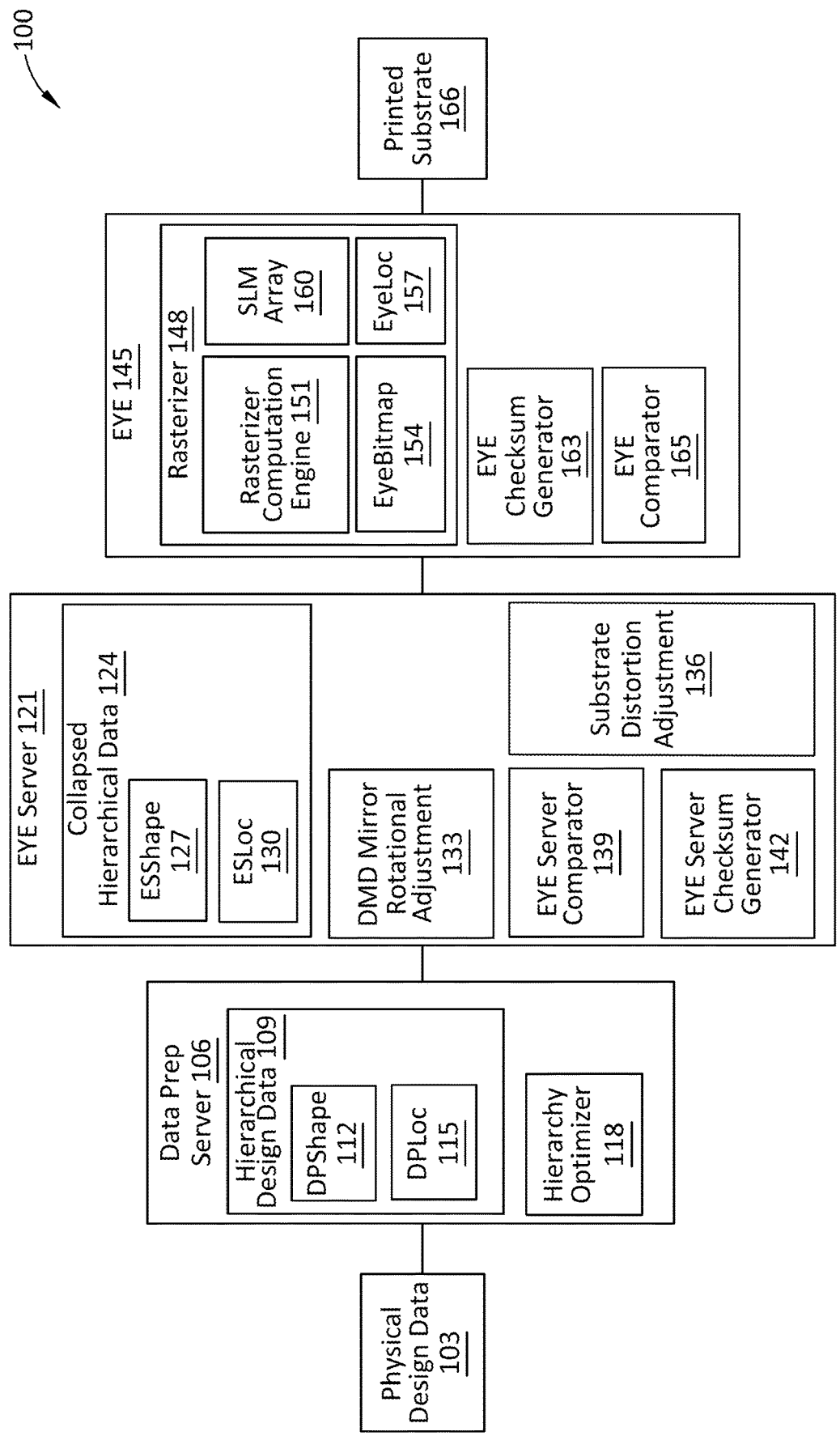
FIG. 1 is a system for data inspection for digital lithography according to disclosed embodiments.

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether a particular advantage is achieved by a given embodiment is not limiting of the disclosure. Thus, the following aspects, features, embodiments, and advantages are merely illustrative and are not considered elements or limitations of the appended claims except where explicitly recited in a claim. Likewise, reference to "the disclosure" shall not be construed as a generalization of any inventive subject matter disclosed herein and shall not be considered an element or limitation of the appended claims except where explicitly recited in the claim.

Aspects of the present disclosure provide apparatuses, methods, processing systems, and computer readable mediums for data inspection for digital lithography systems.

In embodiments, a data prep server receives physical design data and puts it into an optimized hierarchical structure, having individual images as the root nodes comprising repeating images ('repeaters') and images that do not repeat ('singletons') that will later be flattened by the EYE server. The data prep server fractures the physical design into segments corresponding to a segment of a substrate upon which the physical design is to be printed. The optimized design file is sent to an EYE server of a digital lithography (DL) system, that reduces the design hierarchical structure of the data prep server to a two level hierarchy, by flattening the non-repeater nodes to singleton and moving repeater nodes to the top level node. The repeater image in the EYE server is compared to a repeater image of the data prep server to ensure integrity of the data, and all locations of the repeater image of the EYE server are compared to the location of all instances of the repeater image in the data prep server. Similarly, all singleton images and locations in the EYE server are compared to the respective singleton images and locations of the data prep server. Any anomalies as between the compared images and/or locations are flagged and generate a user notification. Once the comparison of data between the data prep server and EYE server are complete, the EYE server creates an EYE server checksum of each image.

The EYE server then provides its data to an EYE of the DL system. Within the EYE, the image data is converted to individual images ready to be printed on a substrate. For each image, an EYE checksum is created, and then compared to the EYE server checksum. Additionally, the location data for the images in the EYE server are directly compared to the location data for each image in the EYE. If an anomaly is detected in either the checksum or location comparison, a notification is provided to a user. Otherwise, the image is sent to a spatial light modulator array, that is exposed to a laser, and the image is printed to a substrate.

Example System for Data Inspection for Digital Lithography

FIG. 1 depicts a system 100 for data inspection for digital lithography according to disclosed embodiments.

Physical design data 103 represents, for example, design data from a user intended for printing on a substrate, and may be in any format suitable for this purpose, such as GDS. Physical design data 103 is provided to a data prep server 106.

Data prep server 106 serves to receive physical design data 103 and convert it to a format consumable by a digital lithography (DL) system such as DL system 200 of FIG. 2, below. In embodiments, the physical design data 103 is placed into a three level hierarchical data structure 109, comprising a top node, second level nodes representing each segment of a substrate upon which printing is to take place, and root nodes each representing an individual image to be printed on the substrate, and it's location on the substrate. Each individual image may be represented as a bitmap, data prep server bitmap (DPShape) 112, and its location on the substrate as data prep server location (DPLoc) 115.

Data prep server 106 in embodiments further comprises a hierarchy optimizer 118. The hierarchy optimizer 118 in some embodiments groups leaf nodes within the second level of the optimized hierarchical structure, as repeaters and non-repeaters. A repeater is a leaf node containing a larger segment of an image that is repeated; that is, the same image appears at more than one location within a segment of a substrate and its content has been registered ahead of the printing. The EYE server only need to forward the location of the repeater for the EYE to generate final bitmap. An additional image classification is a singleton; a singleton is all of the image segments in a non-repeater node. The EYE server will need to forward them to the EYE individually to generate a bitmap image. Each singleton or repeater consumes one data storage unit before the EYE can process them into a bitmap. For each repeater node with small number of segment, the hierarchy optimizer 118, in embodiments, collapses some of the repeater nodes to form a bigger node to reduce storage requirement at EYE and breakup moderate sized non-repeater to make new repeaters comprising a single DPShape 112 and all locations, DPLoc 115, at which the repeater appears within a segment of the substrate. For each leaf node containing a singleton, the hierarchy optimizer 118 preserves the singleton DPShape 112 and the location, DPLoc 115, at which it appears within a segment of the substrate.

In embodiments, the system 100 further comprises an EYE server 121, that receives optimized hierarchical design data 109 from the data prep server for a given segment of a substrate. The EYE server 121, in some embodiments, represents the component 210 of the DL system 200 of FIG. 2 that prints a design onto a defined segment of a substrate. Eye server further comprises an EYE 145 that does the actual printing of a design upon a substrate. One of ordinary skill in the art will appreciate that DL system 200 may comprise more than one EYE server 121.

Eye server 121, in embodiments, receives hierarchical design data 109 and collapses it to form collapsed hierarchical data 124. The collapsed hierarchical data 124 in embodiments comprises a two level hierarchy, in which the first level node represents a segment of a substrate, and the leaves represent EYE server bitmaps (ESShape) 127, and the locations of the ESShapes 127, EYE server location (ESLoc) 130. For each repeater represented in the collapsed hierarchical data 124, there is one ESShape 127 representing the image of the repeater, and multiple locations ESLoc 130 representing all of the locations where the repeater appears in segment represented by the EYE server 121. For each singleton, there is one ESShape 127 representing the image of the singleton and one ESLoc 130 representing the location of the singleton in the segment represented by the EYE server 121.

The collapsed hierarchical data 124 is adjusted for based upon parameters of the substrate upon which the design is to be printed, and the EYE 145 from which the printing is to be done.

Figure 2:
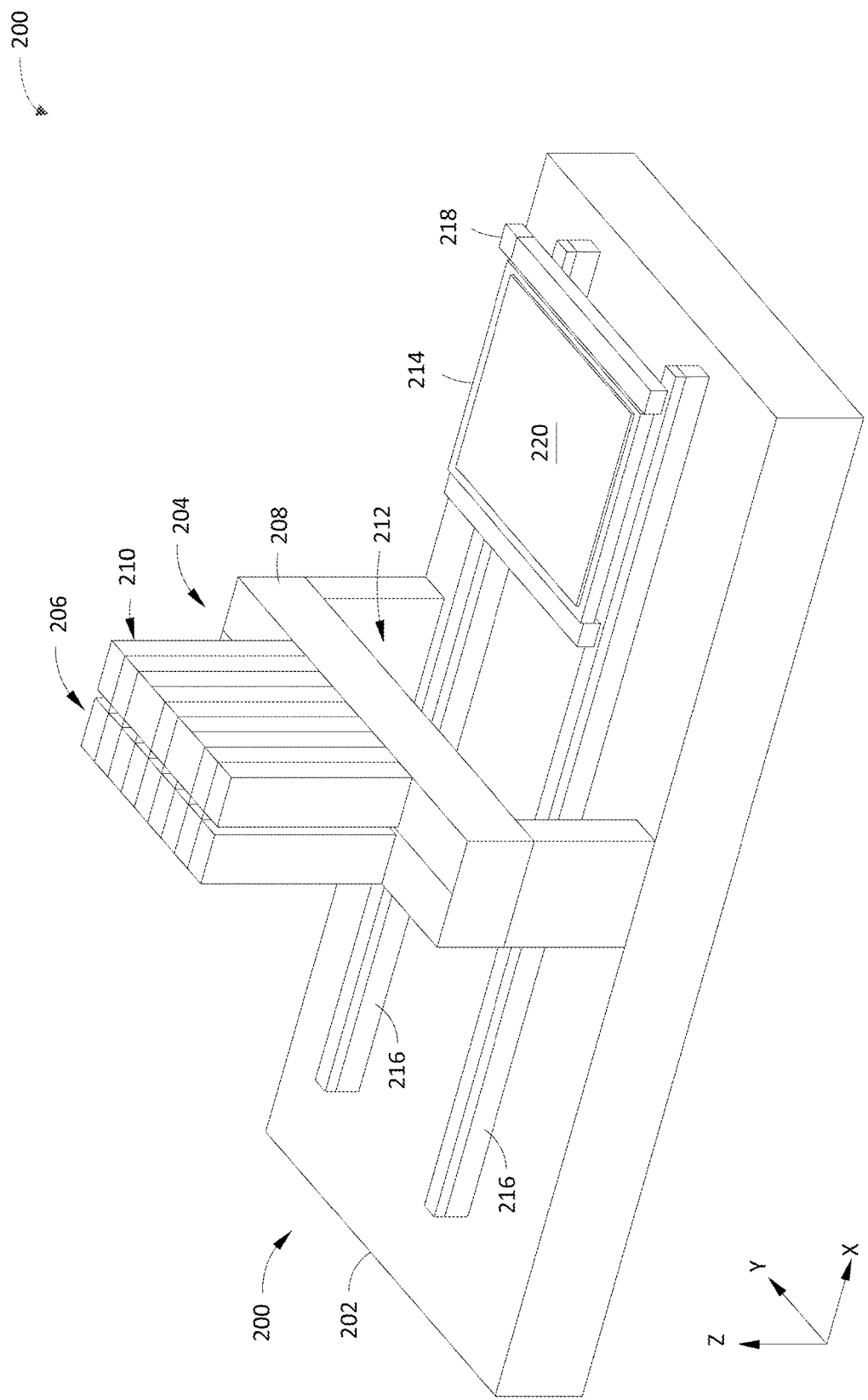
FIG. 2 depicts a digital lithography system for execution of disclosed embodiments.

In embodiments, EYE server 121 comprises a SLM array rotation adjustment 133, that modifies each ESShape 127 and ESLoc 130 of the collapsed hierarchical data 124 based on a rotational bias of a SLM array in the EYE 145 that will present a bitmap image to a laser for exposure to a substrate, such as substrate 220 of FIG. 2.

In further embodiments EYE server 121 comprises a substrate distortion adjustment 136. As is understood by one of skill in the art, each substrate will have physical anomalies that to be accounted for in a desired design, to as to avoid errors when a design is printed to a substrate. Substrate adjustment 136 obtains substrate anomalies and applies the proper correction to each ESShape 127 and ESLoc 130, to ensure the final substrate print is properly carried out.

Eye server 121, in embodiments, further comprises an EYE server comparator 139 that will compare each ESShape 127 and ESLoc 130 of the collapsed hierarchical data 124 to each DPShape 112 and DPLoc 115 of the data prep server 106, to ensure integrity of the collapsed hierarchical data 124 with the physical design data 103. By way of example, EYE server comparator 139 may carry out the comparison via an XOR operation.

In yet another embodiment, EYE server 121 comprises an EYE server checksum generator 142 that generates an EYE server checksum for each ESShape 127, to be used for comparison with the EYE 145. This will comparison be discussed further below.

Once the collapsed hierarchical data 124 has been adjusted and compared, it is streamed to one or more EYEs 145. Eye 145, in embodiments, comprises a rasterizer 148, an EYE comparator 163, and an EYE checksum generator 165.

Rasterizer 148, in some embodiments comprises one or more rasterizer computation engines 151 and in embodiments, one or more spatial light modulator (SLM) arrays 160. In alternate embodiments SLM array 160 may comprise one or more digital micromirror (DMD) devicies, microLED, VCSEL, and/or LCD arrays, or other type of spatial light modulator. Rasterizer computation engine 151 includes one or more field programmable gate arrays (FPGAs), graphics processing units (GPUs), a combination of FPGAs and GPUs, or other processing hard/firmware capable of converting data in an image format to a format understandable by a DMD. ESShape 127 and corresponding ESLoc 130 of the collapsed hierarchical data 124 data are provided to the rasterizer 148 to produce an EyeBitmap 154 image and corresponding EyeLocation 157 location within a substrate segment represented by the EYE server 121, via the Rasterizer computation engine 151, for the SLM array 160 to expose to a laser, and subsequently print to a substrate.

Eye checksum generator 163, in embodiments, generates a checksum of the EyeBitmap 154 image, for comparison to the checksum of the ESShape 127 generated by the EYE server checksum generator 142, received from the EYE server.

Eye comparator 165 compares the checksum of the generated by the EYE checksum generator for a given EyeBitmap 154 to the checksum of the concomitant ESShape 127 generated by the Eye server checksum generator 142. In embodiments, the EYE comparator also compares the EyeLoc 157 for each EyeBitmap 154 to the ESLoc 130 of concomitant ESShape 127. By way of example, the EYE comparator 165 may carry out the comparison via an XOR operation.

Once the EyeBitmap 154 and EyeLoc 157 have been successfully compared to the corresponding ESShape 127 and ESLoc 130, the SLM array 160 is configured to reflect the EyeBitmap 154. The configured SLM array 160 is then exposed to a laser, imprinting the image of the EyeBitmap 154 upon a printed substrate 166.

Example Digital Lithography System

FIG. 2 is a perspective view of an example digital lithography (DL) system 200, according to one or more embodiments. The DL system 200 includes a digital lithography digital lithography device 201. The digital lithography device 201 includes a stage 214 and a processing apparatus 204. The stage 214 is supported by a pair of tracks 216 disposed on a slab 202. A substrate 220 is supported by the stage 214. The stage 214 moves along the pair of tracks 216 in the X direction as indicated by the coordinate system shown in FIG. 2. In one embodiment, the pair of tracks 216 is a pair of parallel magnetic channels. As shown, each track of the pair of tracks 216 extends in a straight line path. An encoder 218 is coupled to the stage 214 in order to provide information of the location of the stage 214 to a controller 222.

The controller 222 is generally designed to facilitate the control and automation the DL system 200. The controller 222 may be coupled to or in communication with the processing apparatus 204, the stage 214, and the encoder 218. The processing apparatus 204 and the encoder 218 may provide information to the controller 222 regarding the substrate processing and the substrate aligning. For example, the processing apparatus 204 may provide information to the controller 222 to alert the controller 222 that substrate processing has been completed.

The substrate 220 comprises any suitable material, for example, glass, which is used as part of a flat panel display. In other embodiments, the substrate 220 is made of other materials capable of being used as a part of the flat panel display. The substrate 220 has a film layer to be patterned formed thereon, such as by pattern etching thereof, and a photoresist layer formed on the film layer to be patterned, which is sensitive to electromagnetic radiation, for example UV or deep UV "light". A positive photoresist includes portions of the photoresist, when exposed to radiation, are respectively soluble to a photoresist developer applied to the photoresist after the pattern is written into the photoresist using the electromagnetic radiation. A negative photoresist includes portions of the photoresist, when exposed to radiation, will be respectively insoluble to photoresist developer applied to the photoresist after the pattern is written into the photoresist using the electromagnetic radiation. The chemical composition of the photoresist determines whether the photoresist is a positive photoresist or negative photoresist. Examples of photoresists include, but are not limited to, at least one of diazonaphthoquinone, a phenol formaldehyde resin, poly(methyl methacrylate), poly(methyl glutarimide), and SU-8. After exposure of the photoresist to the electromagnetic radiation, the resist is developed to leave a patterned photoresist on the underlying film layer. Then, using the patterned photoresist, the underlying thin film is pattern etched through the openings in the photoresist to form a portion of the electronic circuitry of the display panel.

The processing apparatus 204 includes a support 208 and a processing unit 206. In embodiments, processing unit 206 comprises one or more EYE processing units 210. Eye processing unit 210, in some embodiments, includes the EYE server 121 and the EYE 145. The processing apparatus 204 straddles the pair of tracks 216 and is disposed on the slab 202, and thereby includes an opening 212 for the pair of tracks 216 and the stage 214 to pass under the processing unit 206. The processing unit 206 is supported over the slab 202 by a support 208. In one embodiment, the processing unit 206 is a pattern generator configured to expose photoresist in a photolithography process. In some embodiments, the pattern generator is configured to perform a maskless lithography process. The processing unit 206 includes a plurality of image projection systems.

Example Method of Data Inspection for Digital Lithography

Figure 3:
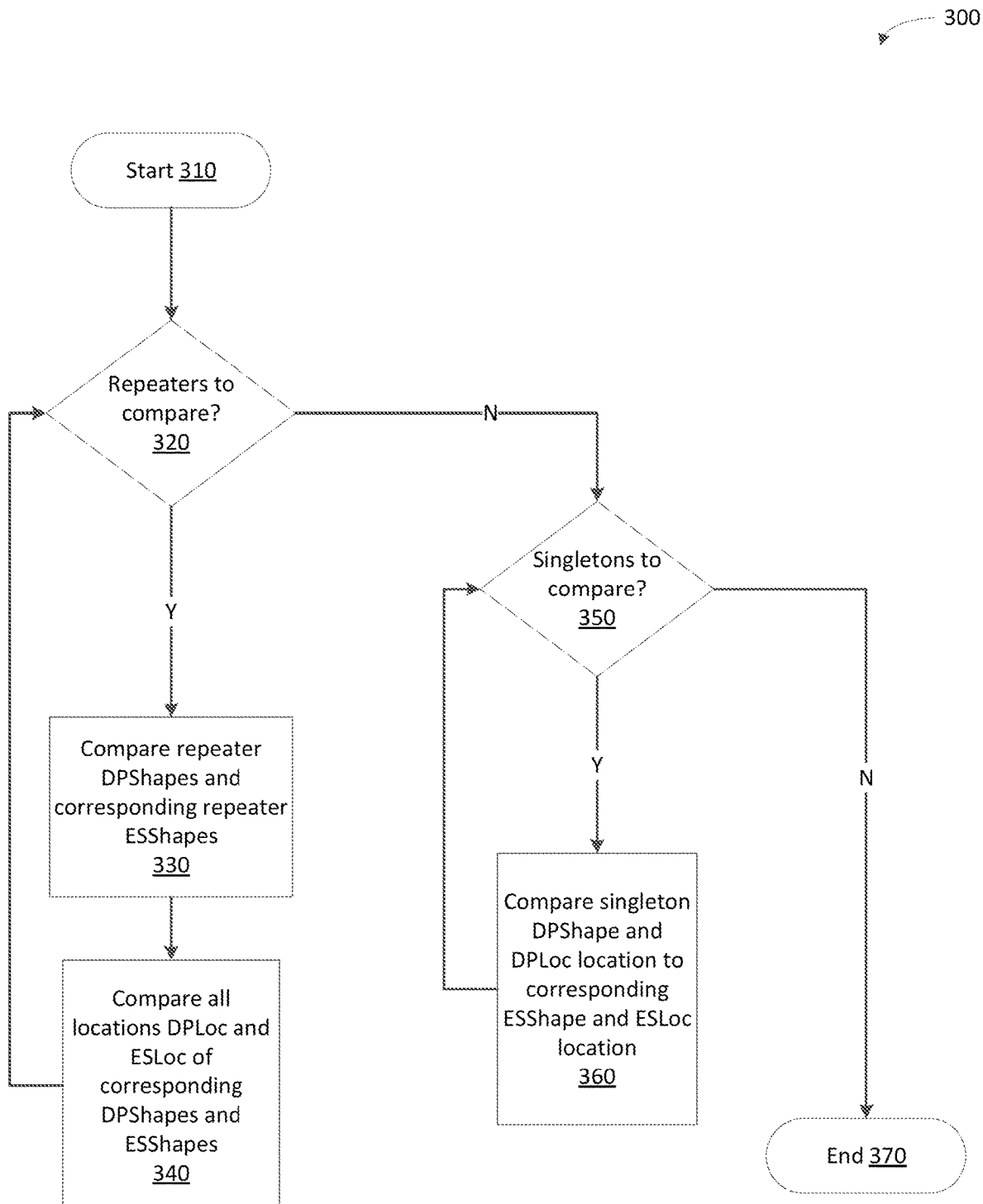
FIG. 3 depicts a method for comparing data from a data preparation server and an EYE server, according to disclosed embodiments.

FIG. 3 depicts a method 300 for comparing data from a data preparation server and an EYE server, according to disclosed embodiments. The method 300 starts at 310.

At 320, an EYE server comparator determines if there are repeaters to compare within a collapsed data hierarchical data of an EYE server and a hierarchical design data of a data prep server, that have not been previously compared. If there are repeaters to be compared, the EYE server comparator retrieves an EYE server bitmap (ESShape) and all EYE server locations (ESLoc) where the ESShape appears in a segment of a substrate governed by the EYE server, and from the data prep server, the related bitmap from a data prep server (DPShape) and each of its locations (DPLoc) in the segment, and the method proceeds to 330. Otherwise, the method proceeds to 350, discussed below.

At 330, the EYE server comparator compares the ESShape to the DPShape. If each comparison is within a defined tolerance, the method proceeds to 340, otherwise, a notification is generated for a user and then proceeds to 340.

One of skill in the art will note that for comparison of repeaters, only a single bitmap image is compared for each repeater as between the data prep server and the EYE server. Because repeaters may make up 99% of a given design, comparing only one bitmap for a repeater saves substantial amount of time, and uses far fewer compute resources.

At 340, the EYE server comparator compares each ESLoc associated with the ESShape to each DPLoc associated with the DPShape. If each comparison is within a defined tolerance, the method proceeds to 320, otherwise, a notification is generated for a user and then proceeds to 320.

At 350 EYE server comparator determines of there are any singletons to compare as between the EYE server and data prep server. If not, the method ends at 370.

If there are singletons to compare, the method proceeds to 360. In embodiments, for each singleton on the EYE server, the EYE server bitmap (ESShape) and data prep server bitmap (DPShape) are compared, as well as their associated locations.

Example Method of Data Inspection for Digital Lithography

Figure 4:
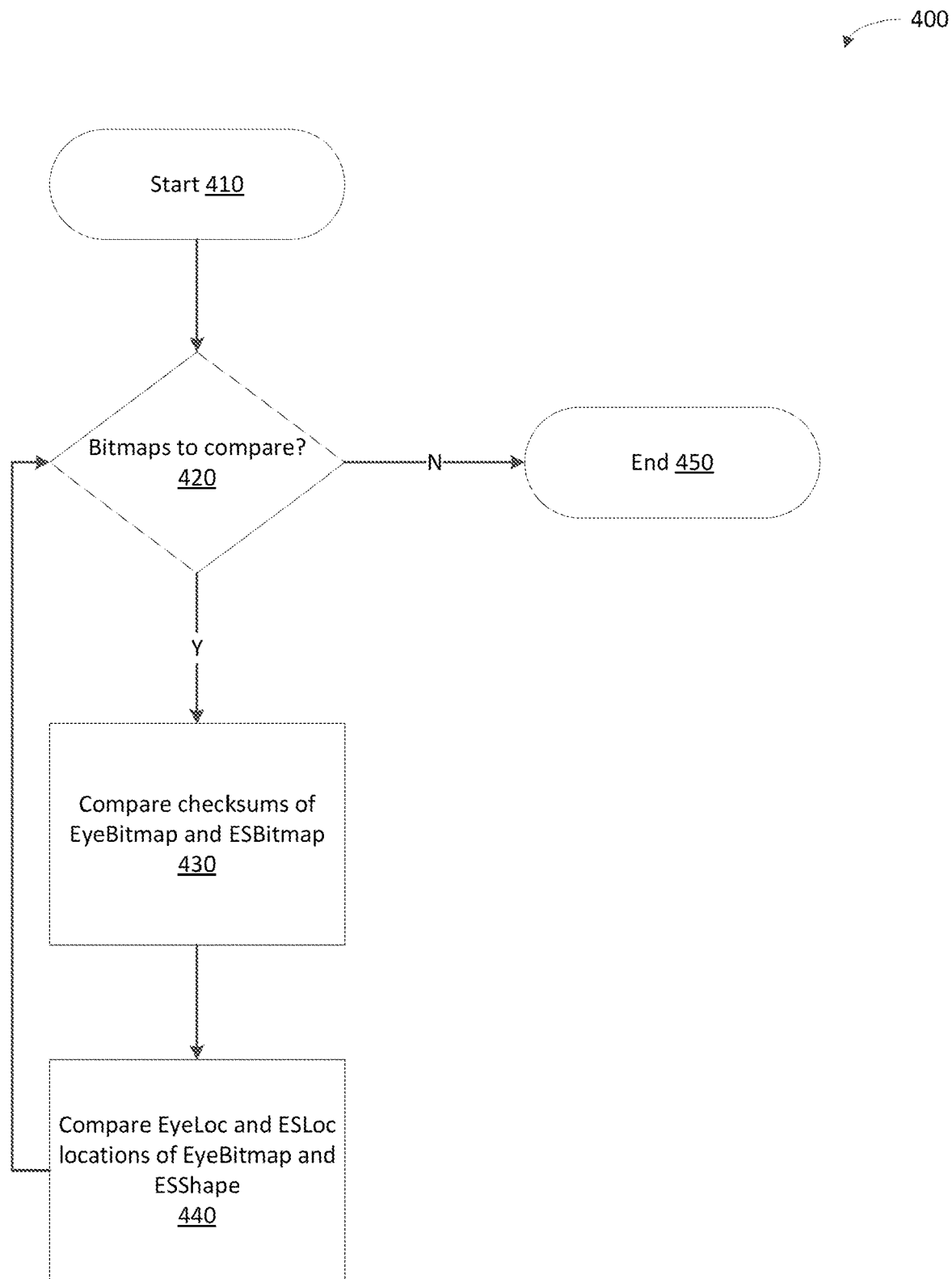
FIG. 4 depicts a method for comparing data from an EYE server and an EYE, according to disclosed embodiments.

FIG. 4 depicts a method 400 for comparing data from an EYE server and an EYE, according to disclosed embodiments. The method 400 begins at 410.

At 420 an EYE comparator determines if there is a bitmap generated by a rasterizer computation engine at the EYE (EYEBitmap) to compare to a related EYE server bitmap (ESShape). The bitmap may be of a repeater or singleton. If there is no EYEBitmap to compare, the method 400 ends at 450. Otherwise, the method 400 proceeds to 430.

At 430 the checksums of the EYEBitmap and ESShape are compared. The EYEBitmap checksum is generated by an EYE checksum generator, while the ESShape checksum is generated by an EYE server checksum generator. When the EYEBitmap checksum is compared to the ESShape checksum, if the comparison is within a user defined tolerance, the method 400 proceeds to 440. Otherwise, a user notification is generated and then the method proceeds to 440.

One of skill in the art will appreciate that the volume of comparisons as between bitmaps of an EYE server and an EYE are enormous, numbering at least in the millions of comparisons. Instead of comparing the EYEBitmap and ESShape, a computationally expensive comparison compounded by the sheer number of bitmaps, a checksum of each of these bitmaps are compared, for example in a computationally inexpensive XOR operation. Comparing the bitmaps in this manner may be done in near real-time, enabling the DL system 200 to proceed with printing the desired circuit on a substrate in a fraction of the time required by previous approaches.

At 440, the EyeLoc and ESLoc locations of each EYEBitmap and ESShape are compared, before proceeding to 420.

Example Method for Data Inspection for Digital Lithography

Figure 5:
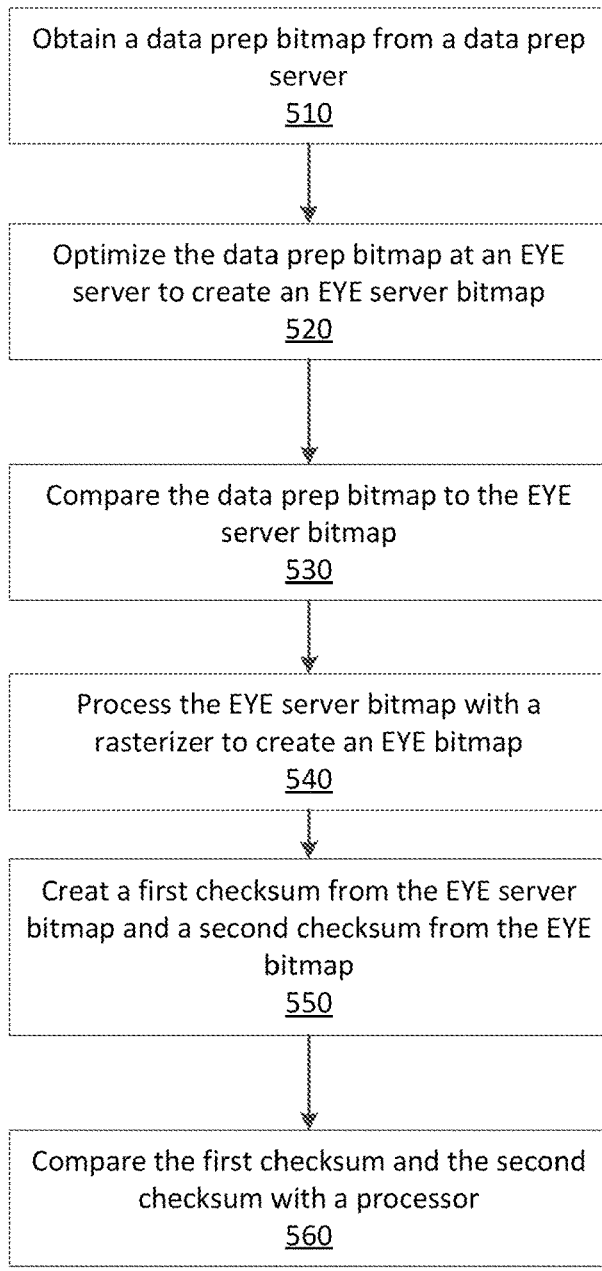
FIG. 5 depicts a method of data inspection for digital lithography, according to disclosed embodiments.

FIG. 5 depicts a method of data inspection for digital lithography, according to disclosed embodiments.

At 510, the method obtains a data prep bitmap from a data prep server. The data prep bitmap, in embodiments, is comprised of hierarchical physical design data that has been optimized into a hierarchical structure for digital lithography. In embodiments, the data prep bitmap is a repeater, that is, a bitmap that repeats within a segment of a design. In embodiments, the data prep repeater comprises a single bitmap image and multiple locations, each location representing a location in a segment of a design where the repeater bitmap image appears.

At 520, the data prep bitmap is flattened to a two-level hierarchy at an EYE server to create an EYE server bitmap. In embodiments, the EYE server bitmap is an EYE optimized data prep bitmap, comprising a single bitmap for every location at which the EYE server repeater, in which all duplicated bitmaps in data prep bitmap are removed. In some embodiments, the optimization comprises modifying the data prep bitmap according to one of a rotational orientation of a DMD array of the rasterizer and a distortion of a substrate.

At 530, the data prep bitmap and EYE server bitmap are compared to ensure the data prep bitmap has been accurately transposed to the EYE server bitmap.

At 540, the EYE server bitmap is transposed to an EYE bitmap with a rasterizer. In some embodiments, the rasterizer comprises one of an FPGA, a GPU, and a combination of FPGAs and GPUs.

At 550, a first checksum is created from the EYE server bitmap and a second checksum is created from the EYE bitmap. In embodiments, the first checksum comprises a checksum of an EYE server repeater, and each checksum of the EYE server repeater is compared to individual ones of a checksum of a plurality of EYE bitmaps, and each of the plurality of second locations is compared to a plurality of third locations corresponding to a respective one of the plurality of EYE bitmaps.

At 560, the first checksum and second checksum are compared with a processor.

Example Processing System for Data Inspection for Digital Lithography

Figure 6:
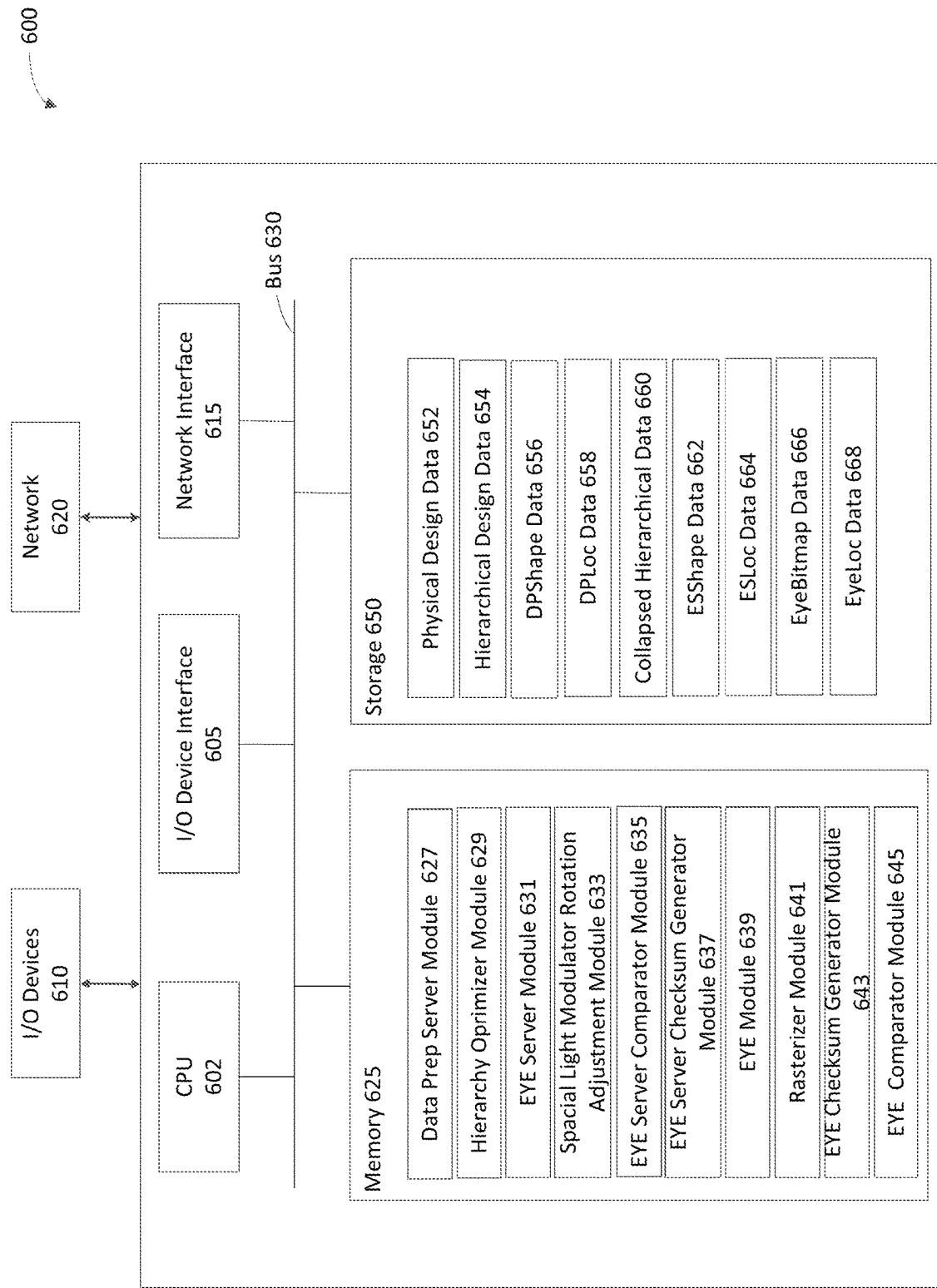
FIG. 6 depicts a processing system for data inspection for digital lithography, according to disclosed embodiments.

FIG. 6 depicts an example processing system for data inspection for digital lithography, for implementing the system of FIG. 1 and/or carrying out the methods of FIGS. 2, 3, and/or 4, as well as other operations described herein with regards to disclosed embodiments.

Processing system 600 includes a CPU 602 connected to a bus 630. CPU 602 is configured to process computer readable instructions, such as stored in memory 625 and/or storage 650, and to cause processing system 600 to perform methods described herein, for example with respect to FIGS. 2, 3, and/or 4. CPU 602 is included to be representative of a single CPU, multiple CPU's, multiple CPU's in separate processing systems or the same processing system, a single CPU having multiple processing cores, and other forms of processing architecture capable of executing computer readable instructions. In some embodiments, CPU 602 may be located, in whole or in part, remotely and accessed via a network. Memory 625 may comprise one or more physical or virtual memory modules, and these may be located in the same, or different, physical processing systems. Moreover, memory 625 may be located remotely and accessed via a network. Storage 650 may comprise one or more physical or virtual storage modules, that may be located in the same, or different, physical processing systems. Moreover, storage 650 may be located remotely and accessed via a network.

Processing system 600 further includes an I/O device interface 605 to provide access to I/O devices band a network interface 615 to provide access to a network 620.

Processing system 600 further includes a memory 626, which in embodiments includes a plurality of modules.

By way of example, memory 625 includes a data prep server module 627 that is configured to perform the operations of a data prep server as described above.

Memory 625 further includes a hierarchy optimizer module 629 that is configured to perform the operations of a hierarchy optimizer as described above.

Memory 625 further includes an EYE server module 631 that is configured to perform operations of an EYE server as described above.

Memory 625 further includes a SLM array rotation adjustment module 633 that is configured to perform operations of a SLM array rotation adjustment as described above.

Memory 625 further includes an EYE server comparator module 635 that is configured to perform the operations of an EYE server comparator as described above.

Memory 625 further includes an EYE module 639 that is configured to perform operations of an EYE as described above.

Memory 625 further includes a rasterizer module 641 that is configured to perform operations of a rasterizer described above.

Memory 625 further includes an EYE checksum generator module 643 that is configured to perform operations of an EYE checksum generator described above described above in FIGS. 1, 4, 5.

Memory 625 further includes an EYE comparator module 645 that is configured to perform operations of an EYE comparator described above in FIGS. 1, 4, 5.

By way of example, storage 650 includes physical design data 652, which may be like physical design data as described in FIG. 1.

Storage 650 further includes hierarchical design data 654 which may be like hierarchical design data as described in FIG. 1.

Storage 650 further includes data prep server bitmap data, or DPShape data 656, which may be like DPShape data as described in FIGS. 1, 3, 4, 5.

Storage 650 further includes data prep server bitmap location data, or DPLoc data, 658, which may be like DPLoc data as described in FIGS. 1, 3, 4, 5.

Storage 650 further includes collapsed hierarchical data 660, which may be like collapsed hierarchical data as described in FIG. 1.

Storage 650 further includes EYE server bitmap data, or ESShape data 662, which may be similar to ESShape data of FIGS. 1, 3, 4, 5.

Storage 650 further includes EYE server bitmap location data, or ESLoc data 664, which may be like ESLoc data of FIGS. 1, 3.

Storage 650 further includes EYE bitmap data 666, which may be like EyeBitmap data of FIGS. 1, 3, 4, 5.

Storage 650 further includes EYE bitmap location data 668, which may be like EleLoc of FIGS. 1, 4.

What is claimed is:

1. A method for data inspection in a lithographic system, the method comprising:
   optimizing a first bitmap to create a second bitmap;
   comparing the first bitmap to the second bitmap;
   processing the second bitmap with a rasterizer to create a third bitmap;
   creating a first data block from the second bitmap and a second data block from the third bitmap; and
   comparing the first data block and second data block with a processor.

2. The method of claim 1, wherein the first bitmap is a data prep repeater, the data prep repeater further comprising a single data prep repeater bitmap image and a plurality of first locations on a substrate.

3. The method of claim 2, wherein the second bitmap is an imaging unit server repeater, the imaging unit server repeater comprising a single imaging unit server repeater bitmap image and a plurality of second locations on a substrate, substantially similar to the first locations.

4. The method of claim 3, wherein the first data block comprises a data block of the imaging unit server repeater, and each data block of the imaging unit server repeater is compared to individual ones of a data block of a plurality of imaging unit bitmaps, and each of the plurality of second locations is compared to a plurality of third locations corresponding to a respective one of the plurality of third bitmaps.

5. The method of claim 1, wherein the first bitmap is optimized by at least one of modifying the first bitmap according to a rotational orientation of a spatial light modulator (SLM) array of an imaging unit, and a distortion in a substrate.

6. The method of claim 5, wherein the first bitmap is comprised of actual design data that has been decomposed into a hierarchical structure.

7. The method of claim 1, wherein the rasterizer for processing the second bitmap comprises one of an FPGA, a GPU, and a combination of FPGAs and GPUs.

8. A digital lithography system comprising:
   a processor; and
   a memory storing instructions which when executed by the processor perform a method for data inspection, the method comprising:
   optimizing a first bitmap to create a second bitmap;

comparing the first bitmap to the second bitmap;
processing the second bitmap with a rasterizer to create a third bitmap;
creating a first data block from the second bitmap and a second data block from the third bitmap; and
comparing the first data block and second data block with the processor.

9. The system of claim 8, the first bitmap is a data prep repeater, the data prep repeater further comprising a single data prep repeater bitmap image and a plurality of first locations on a substrate.

10. The system of claim 9, wherein the second bitmap is an imaging unit server repeater, the imaging unit server repeater comprising a single imaging unit server repeater bitmap image and a plurality of second locations on a substrate, substantially similar to the first locations.

11. The system of claim 10, wherein the first data block comprises a data block of the imaging unit server repeater, and each data block of the imaging unit server repeater is compared to individual ones of a data block of a plurality of third bitmaps, and each of the plurality of second locations is compared to a plurality of third locations corresponding to a respective one of the plurality of third bitmaps.

12. The system of claim 8, wherein the first bitmap is optimized by at least one of modifying the first bitmap according to a rotational orientation of a spatial light modulator (SLM) array of an imaging unit, and a distortion in a substrate.

13. The system of claim 12, wherein the first bitmap is comprised of actual design data that has been decomposed into a hierarchical structure.

14. The system of claim 8, wherein the rasterizer for processing the second bitmap comprises a rasterizer comprising one of an FPGA, a GPU, and a combination of FPGAs and GPUs.

15. A non-transitory computer readable medium comprising instructions that, when executed by a processor of a processing system, cause the processing system to perform a method for data inspection in a digital lithography system, the method comprising:
optimizing a first bitmap to create a second bitmap;
comparing the first bitmap to the second bitmap;
processing the second bitmap with a rasterizer to create a third bitmap;
creating a first data block from the second bitmap and a second data block from the third bitmap; and
comparing the first data block and second data block with the processor.

16. The non-transitory computer readable medium of claim 15, the first bitmap is a data prep repeater, the data prep repeater further comprising a single data prep repeater bitmap image and a plurality of first locations on a substrate.

17. The non-transitory computer readable medium of claim 16, wherein the second bitmap is an imaging unit server repeater, the imaging unit server repeater comprising a single imaging unit server repeater bitmap image and a plurality of second locations on a substrate, substantially similar to the first locations.

18. The non-transitory computer readable medium of claim 17, wherein the first data block comprises a data block of the imaging unit server repeater, and each data block of the imaging unit server repeater is compared to individual ones of a data block of a plurality of third bitmaps, and each of the plurality of second locations is compared to a plurality of third locations corresponding to a respective one of the plurality of third bitmaps.

19. The non-transitory computer readable medium of claim 15, wherein the first bitmap is optimized by at least one of modifying the first bitmap according to a rotational orientation of a DMD array of the rasterizer for processing the second bitmap, and a distortion in a substrate.

20. The non-transitory computer readable medium of claim 19, wherein the first bitmap is comprised of actual design data that has been decomposed into a hierarchical structure.

* * * * *